United States Patent
Aoyama

(10) Patent No.: US 6,467,164 B2
(45) Date of Patent: Oct. 22, 2002

(54) METHOD FOR CONNECTING A TERMINAL FITTING AND A FLAT CONDUCTOR, A TERMINAL CONNECTION APPARATUS AND A TERMINAL FITTING

(75) Inventor: Masahiko Aoyama, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 0 days.

(21) Appl. No.: 09/813,585

(22) Filed: Mar. 21, 2001

(65) Prior Publication Data

US 2001/0027052 A1 Oct. 4, 2001

(30) Foreign Application Priority Data

Mar. 28, 2000 (JP) .................................. 2000-088119

(51) Int. Cl.[7] .............................................. H01R 4/24
(52) U.S. Cl. ........................ 29/866; 29/85 B; 29/857; 439/422
(58) Field of Search .................. 439/422, 421, 439/423, 877; 29/857, 866, 865, 863, 858

(56) References Cited

U.S. PATENT DOCUMENTS

| | | | |
|---|---|---|---|
| 4,082,402 A | | 4/1978 | Kinkaid et al. ............. 439/422 |
| 4,193,658 A | * | 3/1980 | Dittmann ..................... 339/97 |
| 4,433,890 A | * | 2/1984 | Marino et al. ................ 339/97 |
| 4,560,224 A | * | 12/1985 | Weisenburger .............. 339/97 |
| 4,832,620 A | * | 5/1989 | Yamomoto ................... 439/422 |
| 4,950,180 A | * | 8/1990 | Daly et al. ................... 438/422 |
| 5,450,664 A | * | 9/1995 | Babow et al. ................ 29/866 |
| 5,827,998 A | * | 10/1998 | Mariguchi et al. ..... 174/35 MS |
| 6,135,779 A | * | 10/2000 | Koch et al. ................... 439/42 |
| 6,305,968 B1 | * | 10/2001 | Hio et al. ..................... 439/422 |
| 6,312,283 B1 | * | 11/2001 | Hio ............................. 439/422 |
| 6,341,980 B1 | * | 1/2002 | Hio et al. ..................... 439/422 |

FOREIGN PATENT DOCUMENTS

| | | |
|---|---|---|
| JP | 63-73861 | 4/1988 |
| JP | 8-111247 | 4/1996 |

* cited by examiner

Primary Examiner—P. Austin Bradley
Assistant Examiner—Alexander Gilman
(74) Attorney, Agent, or Firm—Anthony J. Casella; Gerald E. Hespos

(57) ABSTRACT

A method is provided for connecting a terminal fitting and a flat conductor to achieve a high contact pressure between the terminal fitting and a conductive path. A FFC (10) has an insulation sheet (12) adjacent the end stripped to expose a conductor (11). The FFC (10) is inserted between first and second squeezing plates (22, 23) of a terminal fitting (20). Complimentary recessed/projected portions (32, 33) are formed on the outer surfaces of a pair of upper and lower press dies (30, 31) for pressing the terminal fitting (20). The terminal fitting (20) is pressed by the press dies (30, 31). Thus, the FFC 10 and the terminal fitting (20) are pressed together into a single unit and the squeezing plates (22, 23) are formed into a zigzag configuration.

6 Claims, 6 Drawing Sheets

METHOD FOR CONNECTING A TERMINAL FITTING AND A FLAT CONDUCTOR, A TERMINAL CONNECTION APPARATUS AND A TERMINAL FITTING

BACKGROUND OF THE INVENTION

1. Field of the Invention

The present invention relates to a terminal fitting for a flat conductor, a method for connecting a terminal fitting to a flat conductor and a terminal connection apparatus.

2. Description of the Related Art

Flexible flat cables (FFCs) and flexible printed circuit boards (FPCs) are referred to generally as flat conductors. The FFC is a ribbon-shaped structure formed from a plurality of parallel conductors and insulation sheets adhered to the front and rear surfaces of the conductors. There are two methods for connecting terminal fittings with the respective conductors near the end of an FFC. The first method connects the terminal fittings while the conductors are left imbedded in the insulation sheets. The second method, on the other hand, strips the insulation sheet off one surface near the end of the FFC, and then connects the terminal fittings with the conductors.

The second method is disclosed in Japanese Utility Model Publication No. 63-73861 and is shown in FIG. 7 of this application. With reference to FIG. 7, the second method starts with an FFC 1 that has an insulation sheet 2 on the front and rear sides of conductors 3. A portion of the insulation sheet 2 is stripped for a specified distance from an end of the FFC 1 to expose the front sides of the conductors 3. The second method then uses a terminal fitting 4 with a connecting portion 5 and a first squeezing plate 6 that extends from the rear end of the connecting portion 5 for connection with a mating terminal fitting (not shown). The terminal fitting 4 also has a second squeezing plate 7 with a base end 7A that is integral with the base end of the first squeezing plate 6. The second squeezing plate 7 can be pivoted about the base end 7A to close and open with respect to the first squeezing plate 6. Crimping pieces 8 are formed at opposite edges of the leading end of the second squeezing plate 7 and extend toward the first squeezing plate 6. The terminal fitting 4 and the FFC1 are connected by squeezing the conductor 3 between the squeezing plates 6 and 7.

The second method merely brings the flat second squeezing plate 7 into surface contact with the conductor 3. Thus, contact pressure is inevitably low, and the electrical contact is not reliable.

The present invention was developed in view of the above problem, and an object of the invention is to provide a method and apparatus for connecting a terminal fitting and a flat conductor as well as a terminal fitting which secure a high contact pressure between the terminal fitting and a conductor.

SUMMARY OF THE INVENTION

The invention is directed to a method for connecting a terminal fitting with a flat conductor. The method comprises exposing a conductor near an end of the flat conductor. The method then comprises arranging at least one pair of squeezing plates of the terminal fitting to at least partly oppose each other at the front and rear sides of the exposed conductor. The method further comprises deforming a portion of the squeezing plates into a deformed configuration. The exposed end portion of the flat conductor then is squeezed by the squeezing plates. Thus, the squeezing plates are deformed into a zigzag configuration and the squeezing plates squeeze the exposed end portion of the flat conductor.

At least one squeezing plate may include at least one holding portion for holding the squeezing plates in a condition where the exposed conductors of the flat conductor are squeezed between the squeezing plates. The holding portion on one squeezing plate may be bent inwardly and crimped into connection with the other squeezing plate. Thus, the terminal fitting and the flat conductor can be connected with a high contact pressure.

The zigzag configuration defines ridges that may extend at an angle different from 0° or 180° to an extension direction of the flat conductor, and preferably substantially normal to the extension direction. Thus, resistance against a force to withdraw the flat conductor from the terminal fitting is high compared to a terminal fitting with ridges that extend parallel to the extension of the flat conductor.

The invention also is directed to a terminal connection apparatus for connecting a flat conductor and a terminal fitting. The apparatus comprises arranging means for arranging at least one pair of squeezing plates of the terminal fitting to oppose each other at opposed sides of an exposed conductor near an end of the flat conductor. The apparatus also comprises deformation means for deforming a portion of the squeezing plates into a zigzag configuration and for squeezing or sandwiching the exposed end portion of the flat conductor by the squeezing plates.

The deformation means may comprise press dies with recessed and projected portions for forming the zigzag configuration. The deformation means preferably deforms the squeezing plates into the zigzag configuration while the squeezing plates squeeze the exposed end of the flat conductor.

The invention also relates to a terminal fitting for connection with a flat conductor. The terminal fitting comprises at least two squeezing plates that can be opposed to each other at the front and rear sides of an exposed portion of a conductive path of the flat conductor. The squeezing plates comprise a portion with a zigzag configuration that extends at least partly in a direction normal to the plane that contains the exposed portion of the conductive part.

The terminal fitting may also comprise at least one holding portion on at least one of the squeezing plates for holding the squeezing plates so that the exposed conductors of the flat conductor remain squeezed between the squeezing plates and under high contact pressure.

The squeezing plates are connected by a bent portion that is folded back at least twice. Additionally, the squeezing plates can be rotated relative to one another about the bent portion.

These and other objects, features and advantages of the present invention will become apparent upon reading of the following detailed description of preferred embodiments and accompanying drawings.

DETAILED DESCRIPTION OF THE PREFERRED EMBODIMENT

Figure 1:
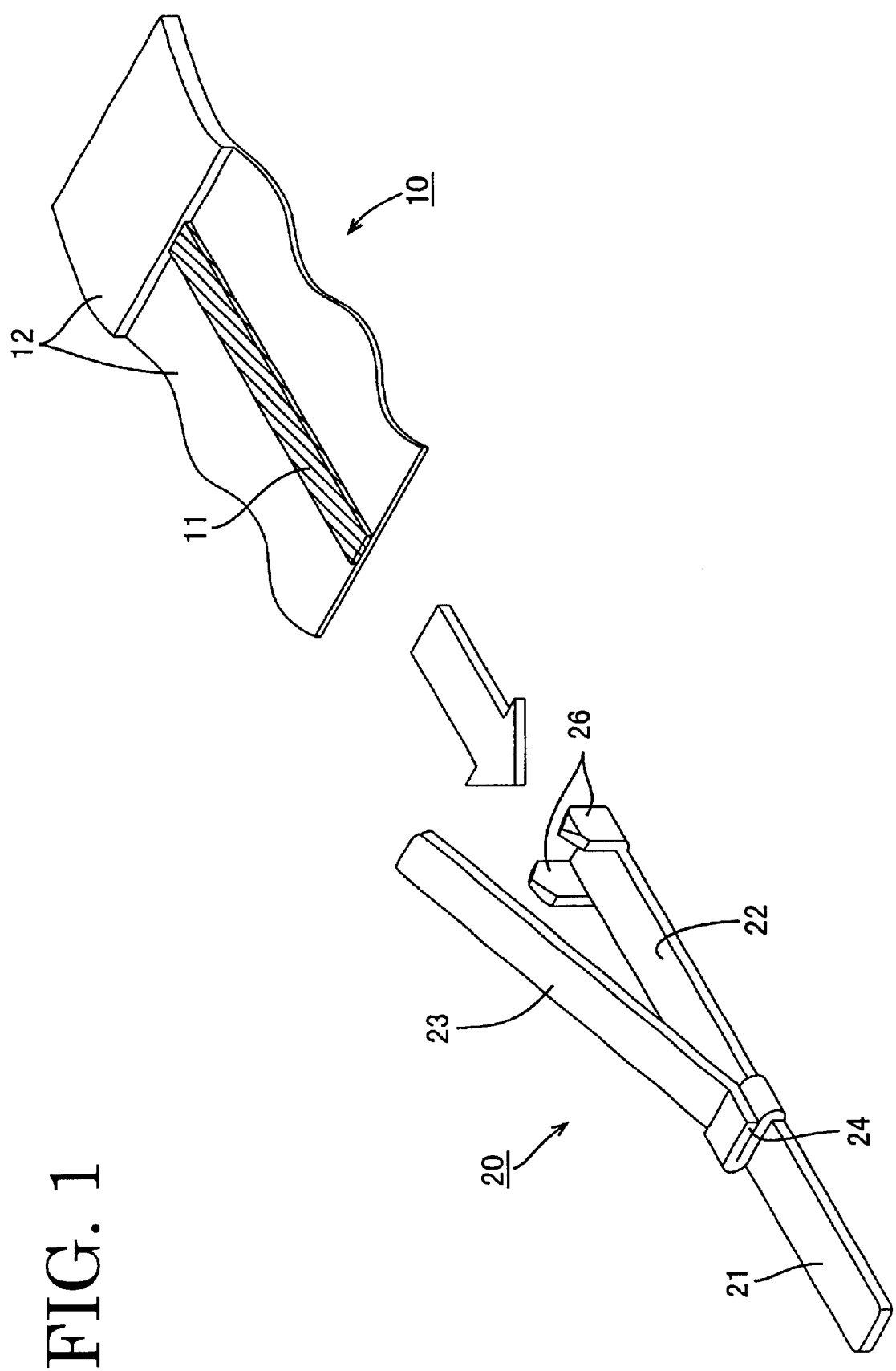
FIG. 1 is a perspective view showing a state before a terminal fitting and a FFC are connected according to one embodiment of the invention.

A terminal fitting in accordance with the invention is identified by the numeral 20 in FIGS. 1–6, and is used with a substantially flexible flat cable 10 (hereinafter referred to as FFC 10). The FFC 10 has a plurality of substantially parallel conductors 11, only one of which is shown in FIG. 1. Insulation sheets 12 are adhered to the front and rear surfaces of the conductors 11 so that the FFC 10 defines a flexible ribbon shape. The insulation sheet 12 on the front surface of the conductors 11 is stripped away for a specified distance from the end of the FFC 10. Thus, the front surfaces of the conductors 11 are exposed adjacent the end of the FFC 10.

Figure 2:
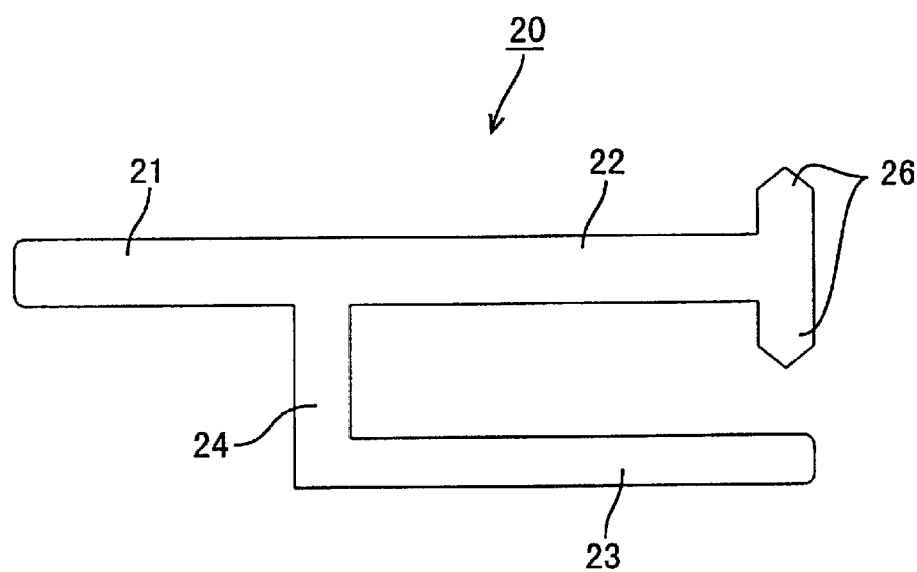
FIG. 2 is a development of the terminal fitting.

The terminal fitting 20 is preferably a male terminal fitting and is formed e.g. by processing a conductive metallic plate material by a press. More particularly, the terminal fitting 20 has a tab 21 that is configured to be mated with a mating female terminal fitting (not shown). A first squeezing plate 22 extends from the rear end of the tab 21. A second squeezing plate 23 initially is substantially parallel to the first squeezing plate 22 and is connected to the first squeezing plate 22 by a bent portion 24 that projects sideways from the rear end of the tab 21, as shown in FIG. 2. The bent portion 24 is folded back twice during the press-forming of the terminal fitting 20 so that the first and second squeezing plates 22 and 23 oppose each other. Thus, the second squeezing plate 23 can be rotated about the bent portion 24 so that the rear end (right side in FIG. 2) of the second squeezing plate 23 can be moved towards or away from the rear end of the first squeezing plate 22 (refer to FIGS. 1 and 6). Accordingly, the space between the opposed first and second squeezing plates 22 and 23 can be opened and closed.

The length of the first and second squeezing plates 22, 23 is substantially equal to the length of the exposed portions of the conductive paths 11 of the FFC 10. Additionally, the widths of the first and second squeezing plates 22, 23 are slightly wider than the widths of the conductors 11.

Crimping pieces 26 are formed at opposite edges of the rear end of the first squeezing plate 22 and extend toward the second squeezing plate 23. The upper ends of the crimping pieces 26 are formed into edges that are sufficiently sharp to make cuts in the FFC 10. The crimping pieces 26 preferably are spaced by a distance greater than the width of the corresponding exposed portion of the conductor 11. The two crimping pieces 26 are substantially opposed to each other in the illustrated embodiment. However, the crimping pieces 26 may be displaced with respect to each other along the longitudinal direction of the first squeezing plate 22.

Figure 3:
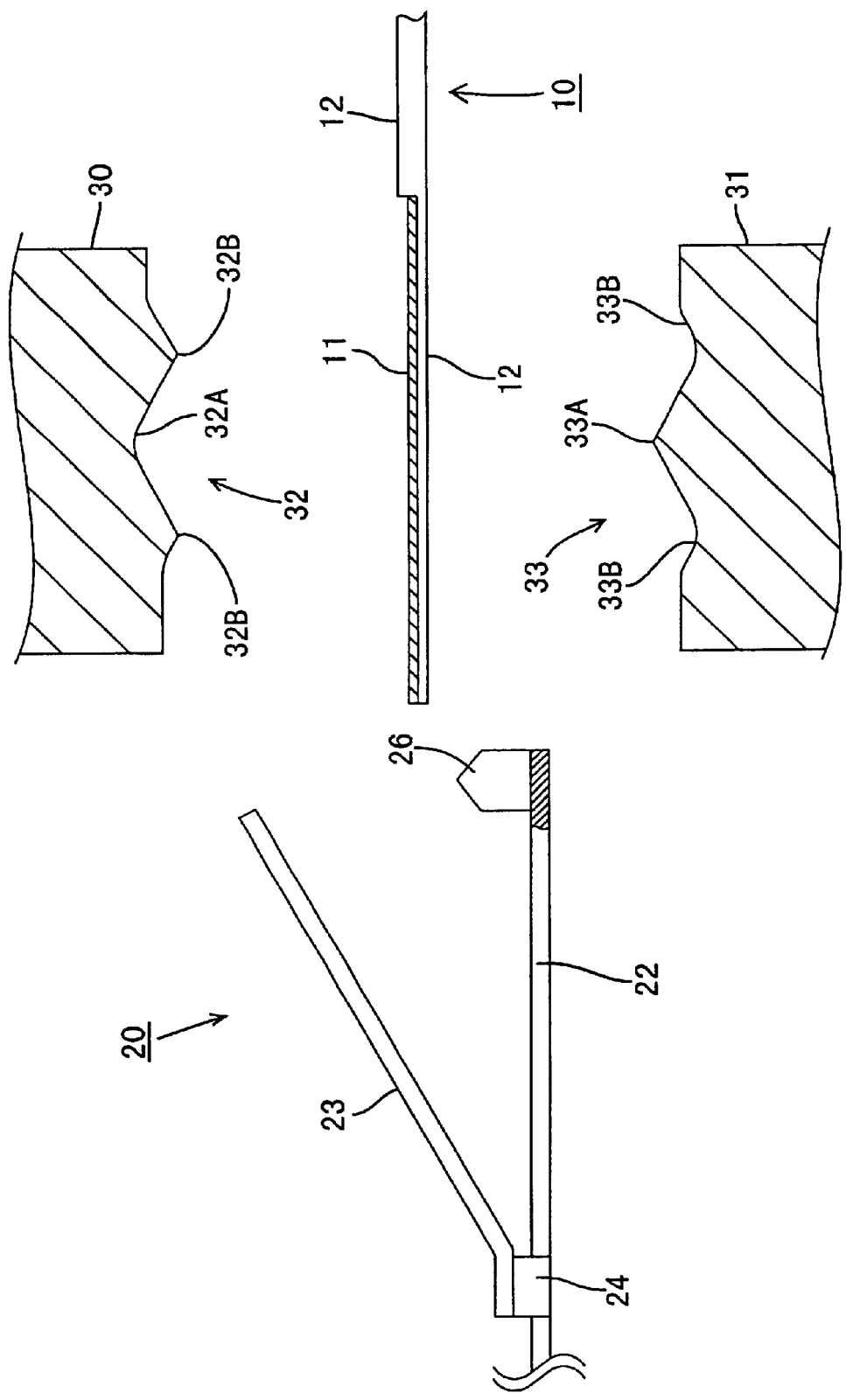
FIG. 3 is a side view partly in section showing a state before the terminal fitting and the FFC are connected.

The squeezing plates 22 and 23 of the terminal fitting 20 are left open, as shown in FIGS. 1 and 3, and an end portion of the FFC 10 with the exposed conductors 11 is inserted between the squeezing plates 22 and 23.

Figure 4:
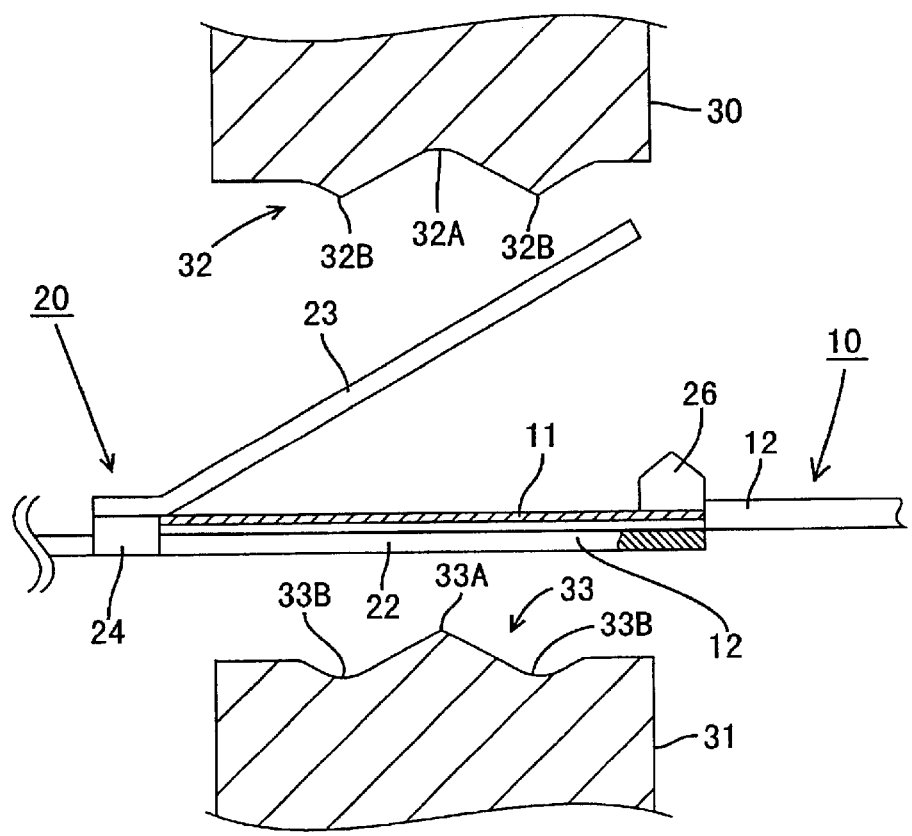
FIG. 4 is a side view partly in section showing a state before the terminal fitting is pressed by press dies.
Figure 5:
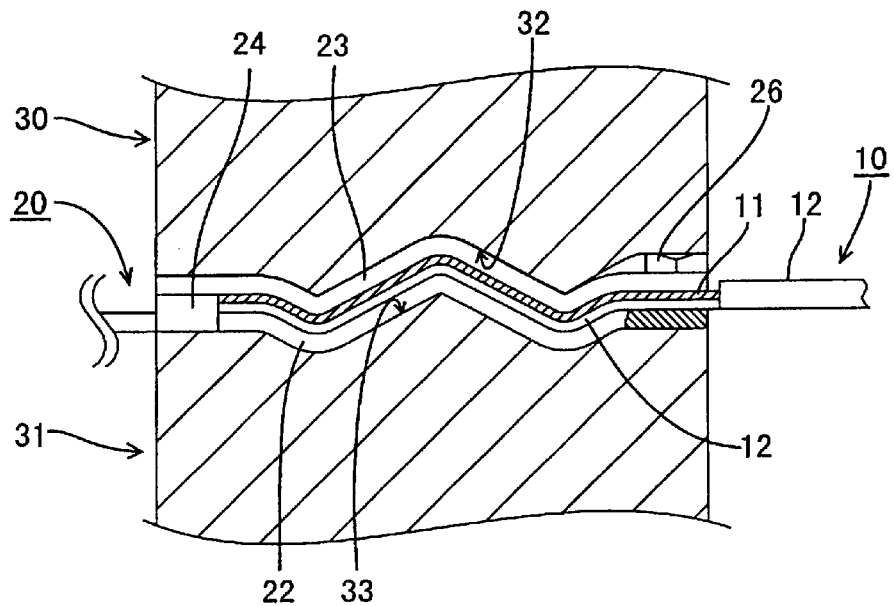
FIG. 5 is a side view partly in section showing a state after the terminal fitting and the FFC are connected.

Next, as shown in FIGS. 4 and 5, the terminal fitting 20 is pressed by press dies 30, 31 from above and below the squeezing plates 22, 23. Recessed/projected portions 32, 33 are provided on the facing surfaces of the upper and lower press dies 30, 31. The recessed/projected portion 32 includes a large recess 32A between two small projections 32B, while the recessed/projected portion 33 includes a large projection 33A between two small recesses 33B. The recessed/projected portions 32, 33 are substantially complementary to each other to avoid displacement when the terminal fitting 20 is pressed.

Figure 6:
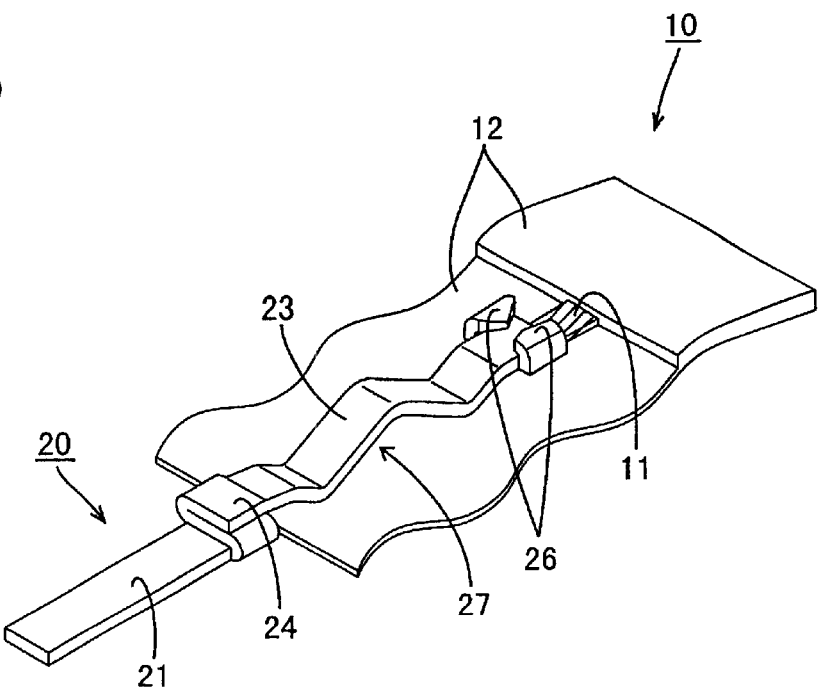
FIG. 6 is a perspective view after the terminal fitting and the FFC are connected.
Figure 7:
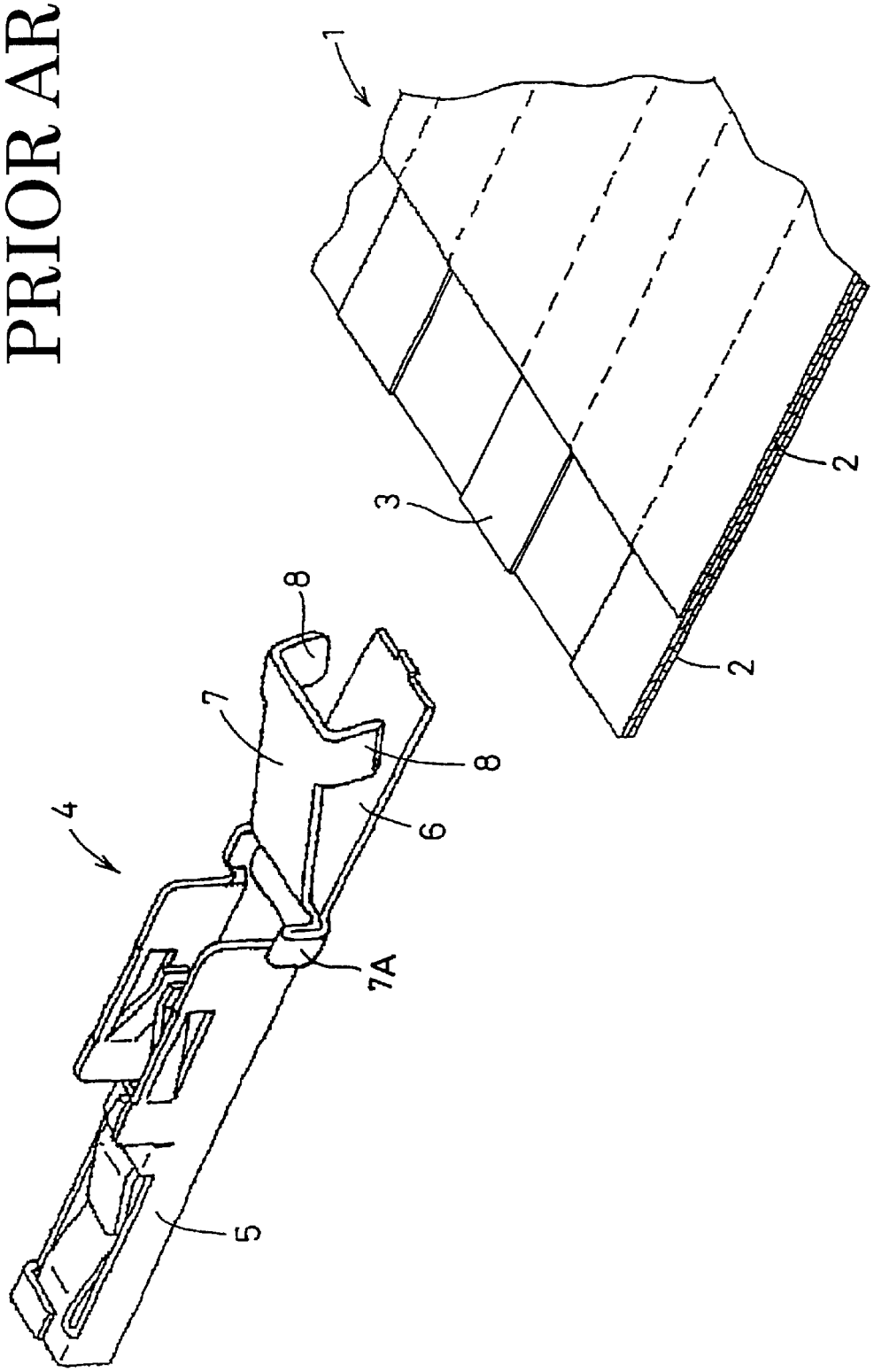
FIG. 7 is a perspective view showing a state before a terminal fitting and a FFC are connected according to a prior art method.

The ridges of the recessed/projected portions 32, 33 preferably extend substantially perpendicular to the longitudinal direction of the terminal fitting 20. Thus, when the terminal fitting 20 and the FFC 10 are connected, the squeezing plates 22, 23 are formed into a zigzag configuration 27 with ridges that extend normal to the extension of the FFC 10. The zigzag configuration 27 extends out of the plane of the exposed conductors 11. More particularly, interaction with the pressing dies 30 and 31 causes the squeezing plates 22 and 23 and the FFC 10 to assume a zigzag configuration 27, as shown in FIG. 6. The zigzag configuration 27 is illustrated with sharp ridges. However rounded ridges may also be possible. In the latter case, the recesses 32A and 33B and projections 33A and 32B are formed accordingly.

The pressing of the terminal fitting 20 and the FFC 10 by the press dies 30, 31 causes the crimping pieces 26 oh the first squeezing plate 22 to penetrate through the insulation sheet 12 at opposite sides of the conductor 11 to reach the front side. The pressing operation deforms the squeezing plates 22, 23 and squeezes the conductive path 11 to define the zigzag configuration 27. Further, the pressing operation bends the crimping pieces 26 inwardly and into crimped connection with opposite side edges at the rear end of the second squeezing plate 23. As a result, the squeezing plates 22 and 23 are connected in their closed state with the exposed portion of the conductive path 11 squeezed therebetween. Thus, the terminal fitting 20 and the FFC 10 are connected with a high contact pressure, and a stable electrical performance is achieved.

The terminal fittings 20 and portions of the FFC 10 connected to the terminal fitting 20 can be accommodated in cavities of a connector housing (not shown). In this state, a backward pulling force that acts in the direction of the arrow F in FIG. 5 may be exerted on the FFC 10. In this embodiment, the zigzag configuration 27 has ridges that extend substantially normal to the extension of the FFC 10. Thus, resistance against a force acting in the direction to withdraw the FFC 10 from the terminal fitting 20 is increased as compared, for example, to a case where the ridges extend parallel to the extension direction of the FFC 10.

The present invention is not limited to the above embodiment. For example, following embodiments are also embraced by the technical scope of the present invention as defined by the claims. Further, the technical scope of the present invention is extended to the scope of equivalents as defined by the claims.

Only one insulation sheet 12 is stripped in the foregoing embodiment. However, both insulation sheets 12 may be stripped according to the present invention.

Although the terminal fitting 20 is a male terminal fitting in the foregoing embodiment, the present invention may be applied to a female terminal fitting.

The FFC 10 is used in the foregoing embodiment. However, the flat conductor is not limited to the FFC according to the present invention. A flexible printed circuit board or the like also may be used.

Although the crimping pieces 26 are formed at the opposite sides of the first squeezing plate 22 in the foregoing embodiment, the holding portions need not be provided at the opposite sides according to the present invention. It may be sufficient to provide at least one holding portion. Further, the holding portion is not limited to the crimping piece 26, but any holding portion may be adopted provided that it can hold a squeezed state of the flat conductor by the two squeezing plates. For example, the holding portion may be a hook projecting from one squeezing plate toward the other.

What is claimed is:

1. A method for connecting a flat conductor and a terminal fitting, the method comprising the steps of:
   providing a terminal fitting with first and second elongate substantially planar squeezing plates having first and second longitudinal ends, the first end of the first squeezing plate being in proximity to the first end of the second squeezing plate, the second end of the first squeezing plate being spaced from the second end of the second squeezing plate, such that said first and second substantially planar squeezing plates are angularly aligned to one another,
   exposing a portion of a conductor adjacent an end of the flat conductor,
   arranging the exposed conductor of the flat conductor between the first and second squeezing plates of the terminal fitting,
   rotating the second end of the first squeezing plate toward the exposed conductor and toward the second end of the second squeezing plate, and
   deforming the squeezing plates and the exposed conductor into a zigzag configuration, such that the exposed conductor of the flat conductor is squeezed by the squeezing plates.

2. A method according to claim 1, wherein the zigzag configuration is formed such that ridges extend substantially normal to an extension direction of the flat conductor.

3. A method according to claim 1, wherein the terminal fitting further comprises a tab projecting from the first squeezing plate and initially defining a plane coplanar with the first squeezing plate prior to the deformation step, the deformation step being carried out to maintain a planar configuration of said tab and for deforming said first and second squeezing plate to define a plurality of parallel ridges spaced from the plane of the tab.

4. A method according to claim 1, wherein at least one holding portion is provided on the first squeezing plate, the method comprising deforming the holding portion for holding the squeezing plates such that the exposed end portion of the flat conductor is squeezed between the squeezing plates.

5. A method according to claim 4, wherein the holding portion is on the first squeezing plate and is crimped substantially into connection with the second squeezing plate.

6. A method according to claim 3, wherein the flat conductor comprises first and second insulation sheaths on opposite sides of the conductor, the step of exposing a portion of the conductor comprising removing the second of said insulation sheets in proximity to the end of the flat conductor, the method further comprising urging the holding portions through the first insulation sheet in proximity to the conductor prior to the step of deforming the holding portion.

* * * * *